(12) United States Patent
Gallagher et al.

(10) Patent No.: US 7,198,872 B2
(45) Date of Patent: Apr. 3, 2007

(54) LIGHT SCATTERING EUVL MASK

(75) Inventors: Emily E. Gallagher, Burlington, VT (US); Louis M. Kindt, Milton, VT (US); Carey W. Thiel, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 10/709,733

(22) Filed: May 25, 2004

(65) Prior Publication Data
US 2005/0266317 A1    Dec. 1, 2005

(51) Int. Cl.
*G03F 1/00* (2006.01)

(52) U.S. Cl. .......................................... 430/5
(58) Field of Classification Search .................... 430/5, 430/394; 378/35
See application file for complete search history.

(56) References Cited

U.S. PATENT DOCUMENTS

| | | | |
|---|---|---|---|
| 5,572,564 A | 11/1996 | Murakami | |
| 6,229,871 B1 | 5/2001 | Tichenor | |
| 6,368,942 B1* | 4/2002 | Cardinale | 438/459 |
| 6,410,193 B1* | 6/2002 | Stivers et al. | 430/5 |
| 6,479,195 B1* | 11/2002 | Kirchauer et al. | 430/5 |
| 6,927,004 B2* | 8/2005 | Eurlings et al. | 430/5 |
| 2002/0192571 A1 | 12/2002 | Schwarzl | |
| 2004/0126673 A1* | 7/2004 | Udagawa et al. | 430/5 |
| 2005/0250019 A1* | 11/2005 | Lin | 430/5 |

OTHER PUBLICATIONS

M.S. Hibbs, B.J. Lin, R.L. Mohler, L.A. Nesbit, "Black-Hole Reflective Mask", IBM Technical Disclosure Bulletin, vol. 32, No. 7, Dec. 1989, pp. 337-339.

* cited by examiner

*Primary Examiner*—S. Rosasco
(74) *Attorney, Agent, or Firm*—Gibb I.P. Law Firm, LLC; Richard M. Kotulak, Esq.

(57) ABSTRACT

A light scattering EUVL mask and a method of forming the same comprises depositing a crystalline silicon layer over an ultra low expansion substrate, depositing a hardmask over the crystalline silicon layer, patterning the hardmask; etching the crystalline silicon layer, removing the hardmask, and depositing a Mo/Si layer over the crystalline silicon layer, wherein etched regions of the crystalline silicon layer comprise uneven surfaces in the etched regions. The method further comprises depositing a photoresist mask over the hardmask, creating a pattern in the photoresist mask, and transferring the pattern to the hardmask. The Mo/Si layer comprises uneven surfaces conformal with the sloped surfaces of the crystalline silicon layer, wherein the sloped surfaces of the Mo/Si layer may be configured as roughened, jagged, sloped, or curved surfaces, wherein the uneven surfaces deflect incoming extreme ultraviolet radiation waves to avoid collection by exposure optics and prevent printing onto a semiconductor wafer.

48 Claims, 5 Drawing Sheets

180 US 7,198,872 B2

LIGHT SCATTERING EUVL MASK

BACKGROUND OF INVENTION

1. Field of the Invention

The invention generally relates to reflective masks, and more particularly to a light scattering and radiation reflective EUVL mask.

2. Description of the Related Art

The optical lithographic technique that is used to image wafers throughout the semiconductor industry relies on transparent masks to transfer an image from the mask to the wafer. As wafer images shrink, new ways of imaging the wafer resist are needed. One likely candidate for the Next Generation Lithography uses Extreme Ultraviolet (EUV) light to image. At the 13.4 nm EUV wavelength, materials are too absorptive to build a transmissive mask, so reflective ones are used instead. Conventional Extreme Ultraviolet Lithography (EUVL) masks, such as the mask illustrated in FIG. 1, are built by depositing a reflective film onto an ultra low expansion (ULE) substrate 10. Material properties of ULE substrates are well known in the art. This film can be composed of many different materials. The most commonly deployed reflective Bragg mirror for EUVL mask applications is created with multiple (as many as forty or more) alternating bilayers of molybdenum (Mo) and silicon (Si), finishing with a protective Si cap shown collectively as a Mo/Si multilayer 20. A buffer layer 30 and absorber layer 40 are then deposited on the multilayer stack 20. Additional layers can be deposited anywhere within the capping/buffer/absorber stack for different purposes, such as to provide an etch stop or conductive inspection/repair layer. The mask pattern is written onto a resist layer using standard mask patterning processes. A dry etch transfers the pattern through the absorber layer. Inspection and repair are performed to ensure that the absorber pattern matches the design data and then the final pattern is transferred through the buffer layer to expose the reflective multilayer surface.

There are many material challenges inherent in building and using an EUVL mask. One fundamental mask issue is the selection of absorber and buffer materials that combine ideal chemical durability, adhesion, dry etch characteristics and optical. Moreover, maintaining the quality (and hence reflectivity) of the capping layer's reflective surface during mask processing is difficult.

Generally, conventional optical masks include transmissive regions that permit light to pass onto the wafer and absorptive regions that block the light. However, the masks used in the EUVL system, introduce a new set of challenges. Because an EUVL mask is reflective, the EUV radiation must be exposed to the mask surface at an angle such that the pattern will reflect onto the surface of the wafer. Specifically, light incident on the exposed reflective surface is reflected. Light incident on the patterned absorber film is absorbed, not reflected; an essential component to imaging. A by-product of this absorption is that the radiation heats the mask and must be controlled to avoid pattern distortion and also to limit heat-induced wear that would decrease mask lifetime. Experiments have shown that 5 degrees is the optimal angle of exposure.

The absorber stack height is finite and creates a shadow under the angle of illumination which blurs the edge of the raised absorber when imaged. This reduction in contrast is a function of the angle of the incident exposure light and both the absorber and buffer layer thickness. Reduced contrast at the pattern edges is a significant issue since it can result in shifted or mis-sized images on the wafer.

The industry has sought to overcome these identified challenges, yet a solution has not been adequately defined. Therefore, due to the limitations of the conventional devices and processes, there is a need for a novel EUVL mask which overcomes the problems associated with the standard techniques.

SUMMARY OF INVENTION

The invention overcomes the above-identified problems by eliminating both the buffer and absorber layers of the mask stack entirely. The invention provides a light scattering extreme ultraviolet lithography mask wherein a silicon molybdenum multilayer is deposited over a patterned blank with specific topography that causes the EUV radiation to be reflected in areas where the exposure light is intended to impinge on the wafer and scattered in areas where the light is not intended to reach the wafer. The topography in the regions intended to reflect light onto the wafers are configured as flat regions. However, in regions where the EUV radiation is not intended to reach the surface of the wafer, the topography is configured such that it scatters the radiation out of the imaging optics of the stepper and hence would not print.

Specifically, the invention provides an extreme ultraviolet lithography mask comprising an ultraviolet reflective region and an ultraviolet scattering region, wherein the reflective region and the scattering region are comprised of the same material. The reflective region comprises a molybdenum and silicon multilayer, wherein the multilayer comprises a flat surface configured to reflect incoming ultraviolet radiation waves for imaging on a semiconductor wafer. The scattering region comprises a molybdenum and silicon multilayer, wherein the multilayer comprises one or more sloped surfaces configured at an angle chosen to deflect incoming ultraviolet radiation waves to prevent/avoid collection by the exposure optics and to prevent imaging onto a semiconductor wafer, wherein the angle is greater than a collection angle of the exposure optics. In alternate embodiments, the scattering region comprises a roughened surface, a jagged surface, or a curved surface configured to deflect incoming ultraviolet radiation waves to prevent/avoid collection by the exposure optics and to prevent printing onto a semiconductor wafer.

Moreover, the invention provides a light scattering reflective mask comprising an ultra low expansion substrate, a crystalline silicon layer on top of the ultra low expansion substrate, and a radiation reflecting and light scattering multilayer comprising molybdenum and silicon on top of the crystalline silicon layer. The multilayer conforms to the underlying silicon layer to have a level portion and an uneven portion. The level portion is configured to reflect incoming ultraviolet radiation waves onto a semiconductor wafer. In one embodiment, the uneven portion comprises a sloped configuration arranged at an angle to deflect incoming ultraviolet radiation waves to prevent light from reaching the semiconductor wafer. In another embodiment, the uneven portion comprises a roughened surface configured to deflect incoming ultraviolet radiation waves to prevent/avoid collection by the exposure optics and to prevent printing onto a semiconductor wafer. In yet another embodiment, the uneven portion comprises a jagged surface configured to deflect incoming ultraviolet radiation waves to prevent/avoid collection by the exposure optics and to prevent printing onto a semiconductor wafer. Alternatively, the uneven portion comprises a curved surface configured to deflect incoming ultraviolet radiation waves to prevent/ avoid collection by the exposure optics and to prevent printing onto a semiconductor wafer.

Another aspect of the invention provides a method of forming an extreme ultraviolet lithography mask by anodically bonding a crystalline silicon layer on top of an ultra low expansion substrate, and then depositing a conformal multilayer comprising molybdenum and silicon on top of the crystalline silicon layer, wherein the multilayer comprises a surface having a level portion to reflect light onto the wafer and an uneven portion to scatter light so that it does not impinge on the wafer. Prior to the step of depositing the reflective multilayer, the method further comprises depositing a hardmask over the crystalline silicon layer, depositing a photoresist mask over the hardmask, creating a pattern in the photoresist mask, and transferring the pattern to the hardmask. The method further comprises etching the crystalline silicon layer to produce an uneven surface in etched regions of the crystalline silicon layer, and removing the hardmask. Additionally, the pattern is transferred to the hardmask using a plasma etch, wherein the etching of the crystalline silicon comprises an anisotropic wet etch, which is performed using an alkaline solution such as aqueous potassium hydroxide (KOH), tetramethylammonium hydroxide (TMAH), or ethylene diamine pyrocatechol (EDP). Furthermore, the etching is performed along <100> lattice planes of the crystalline silicon layer.

Moreover, the level regions are configured to reflect incoming ultraviolet radiation waves for printing a semiconductor wafer, and in a first embodiment, the uneven regions comprises sloped surfaces conformal to the underlying crystalline silicon layer, wherein the sloped surfaces are configured at an angle to deflect incoming extreme ultraviolet radiation waves to prevent printing to a semiconductor wafer, wherein the angle is 54 degrees from normal. In a second embodiment, the method comprises configuring the uneven portion to have a roughened surface to deflect incoming ultraviolet radiation waves to prevent printing to a semiconductor wafer. In a third embodiment, the method comprises configuring the uneven regions to have a jagged surface to deflect incoming ultraviolet radiation waves to prevent printing to a semiconductor wafer. In another embodiment, the method comprises configuring the uneven regions to have a curved surface to deflect incoming ultraviolet radiation waves to prevent printing to a semiconductor wafer.

The invention eliminates the need for a buffer or absorber layer within the mask stack and overcomes the problems inherent with conventional EUVL masks previously described. Because the multilayer is deposited as the final step in the mask fabrication, the multilayer will not be subjected to the plasma etches, wet etches, and multiple cleans that degrade the multilayer in the standard EUVL mask process and consequently reduce the mask reflectivity. In this invention, the higher reflectivity increases the mask contrast between reflective and scattering regions, decreases the required exposure time, and reduces the amount of radiation that is absorbed by the mask.

The inventive mask comprises a substrate (which may include a bonded crystalline Si layer) and the multilayer without an absorber or buffer layer. The absence of a raised absorber stack eliminates the shadow effect during wafer printing. This results in an abrupt transition from dark to reflective mask regions and the effect is an improvement in the edge contrast on the lithographic wafer.

These and other aspects of the invention will be better appreciated and understood when considered in conjunction with the following description and the accompanying drawings. It should be understood, however, that the following description, while indicating preferred embodiments of the invention and numerous specific details thereof, is given by way of illustration and not of limitation. Many changes and modifications may be made within the scope of the invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
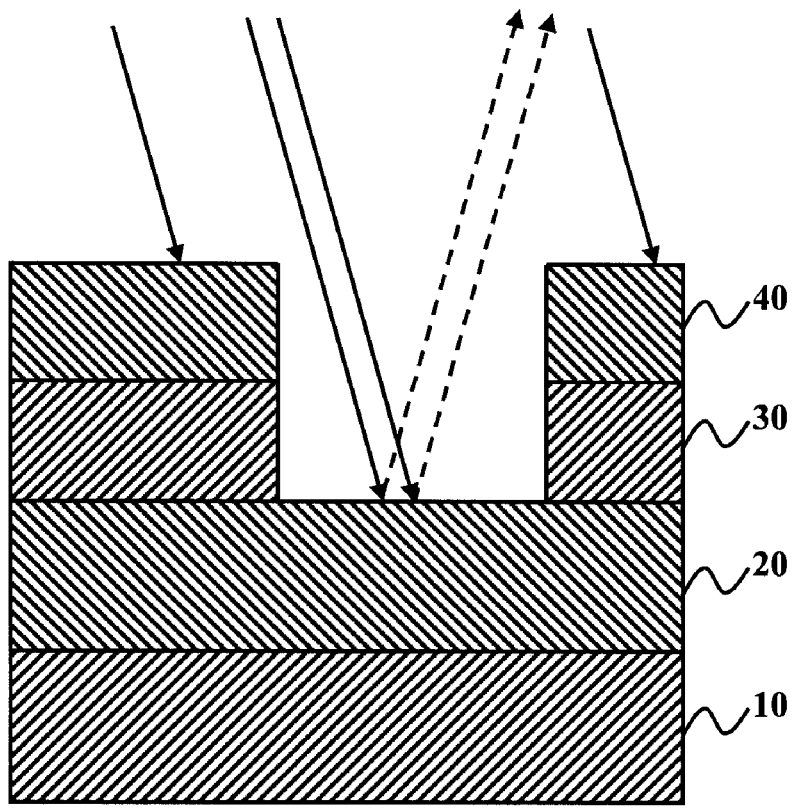
FIG. 1 is a schematic cross-sectional diagram of a conventional EUVL mask.

The invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the invention. The examples used herein are intended merely to facilitate an understanding of ways in which the invention may be practiced and to further enable those of skill in the art to practice the invention. Accordingly, the examples should not be construed as limiting the scope of the invention.

As previously mentioned, there is a need for a novel EUVL mask and method of manufacturing an EUVL mask, which overcomes the problems associated with the standard masks and associated manufacturing techniques. Referring now to the drawings, and more particularly to FIGS. 2 through 5(b), there are shown preferred embodiments of the invention.

Figure 2:
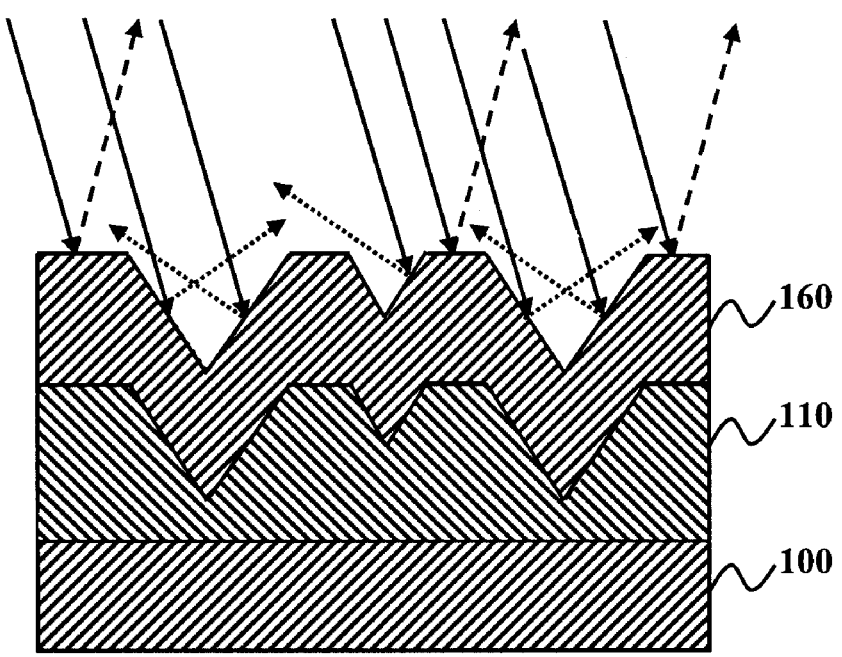
FIG. 2 is a schematic cross-sectional diagram of an EUVL mask according to an embodiment of the invention.

In a first embodiment, the invention provides an EUVL mask that has partially sloped surfaces configured as sloped sidewalls as depicted in FIG. 2. While not explicitly shown in the figures, those skilled in the art would readily understand that the sloped sidewalls could be configured to be generally curvilinear (either convexly or concavely) shaped. As illustrated in FIG. 2, the incoming EUV radiation at 5 degrees is depicted as the solid arrows, and normal EUV reflection is shown as the dashed arrows. The radiation that is reflected off of the flat surface of the multilayer 160, shown with the dashed arrows, will be printed on the wafer. In the patterned areas with the sloped sidewalls, the radiation is deflected at an angle that will not print on the wafer. The out of plane reflections are depicted as the dotted arrows in FIG. 2.

The invention configures a ULE substrate 100 with a layer of crystalline silicon 110.

Figure 3A:
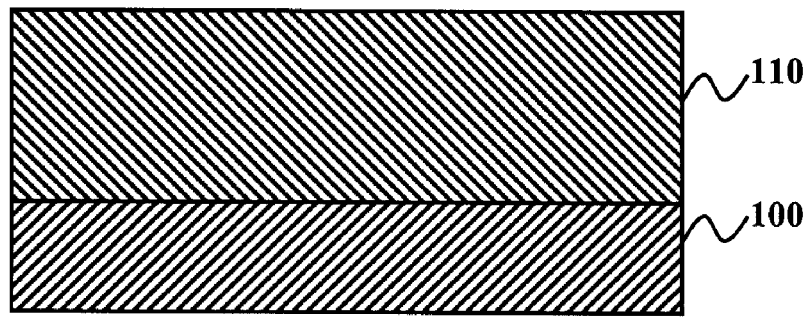
FIG. 3(a) through 3(e) are schematic cross-sectional diagrams illustrating sequential processing steps in the manufacturing of an EUVL mask according to an embodiment of the invention.

FIGS. 3(a) through 3(e) illustrate the sequential processing steps involved in manufacturing an EUVL mask according to the invention. Preferably, the invention joins a layer of crystalline silicon 110 on a quartz substrate 100 by anodically bonding a silicon wafer to quartz as shown in FIG. 3(a). Anodic bonding is a process well-known to those skilled in the art, and may include the general process described in U.S. Pat. No. 6,368,942, the complete disclosure of which, in its entirety, is herein incorporated by reference.

Figure 3B:
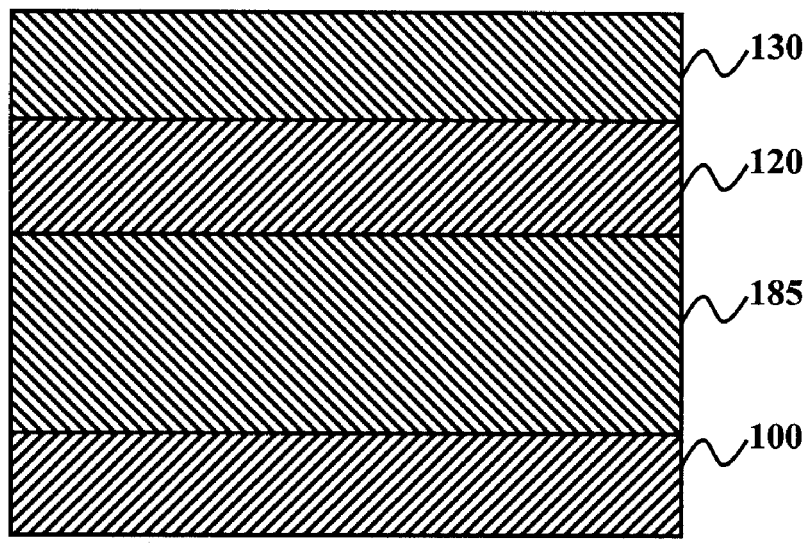
Figure 3C:
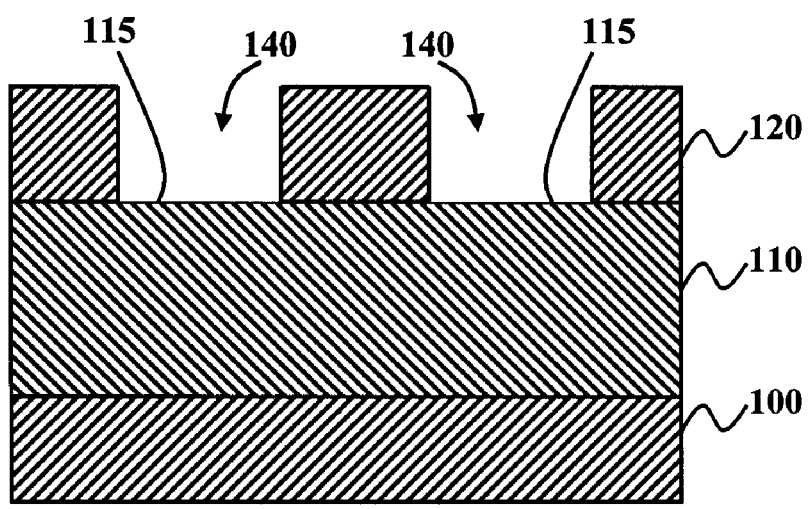

The next steps of the invention involve depositing a hardmask 120 and resist 130 upon the crystalline silicon layer 110 as shown in FIG. 3(b). Then, as illustrated in FIG. 3(c), the desired pattern is written in the resist 130 and the pattern is transferred to the hardmask 120 through a plasma etch. This creates opened regions (openings) 140 in the hardmask 120, wherein the openings 140 are patterned down to the surface 115 of the underlying crystalline silicon 110.

Figure 3D:
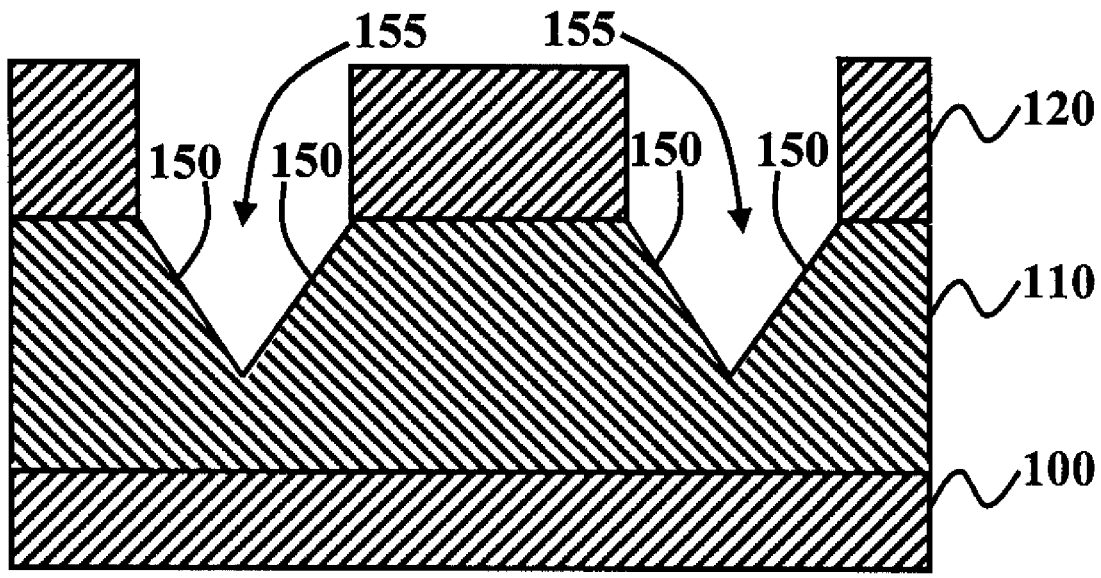

The next step, as shown in FIG. 3(d), is to wet etch the crystalline silicon 110 anisotropically, preferably with a wet etch solution, such as aqueous potassium hydroxide (KOH), tetramethylammonium hydroxide (TMAH), or ethylene diamine pyrocatechol (EDP). The silicon 110 is etched along the <100> lattice planes preferably giving approximately a 54 degree sidewall slope of crystalline silicon 110 in the opened regions 140 (thereby resulting in opened sloped regions 155) defined by the crystalline silicon 110, thereby resulting in sloped sidewalls 150. The <111> crystal plane of crystalline silicon etches much more slowly that the other crystal planes of silicon in alkaline solutions by at least a factor of 100 (more slowly). Hence, in <100> silicon, sloped sidewalls 150 with an angle of 54 degrees result because the <111> plane does not etch as fast as the other crystal planes. Ultimately, if the features are small enough or the silicon thick enough, the reaction is self-terminating. For instances where there are large regions of open space which are required to absorb or scatter the incident EUVL light, this pattern can be repeated. This creates multiple "wells" that act together to reflect the EUV light out of the focal plane.

Figure 3E:
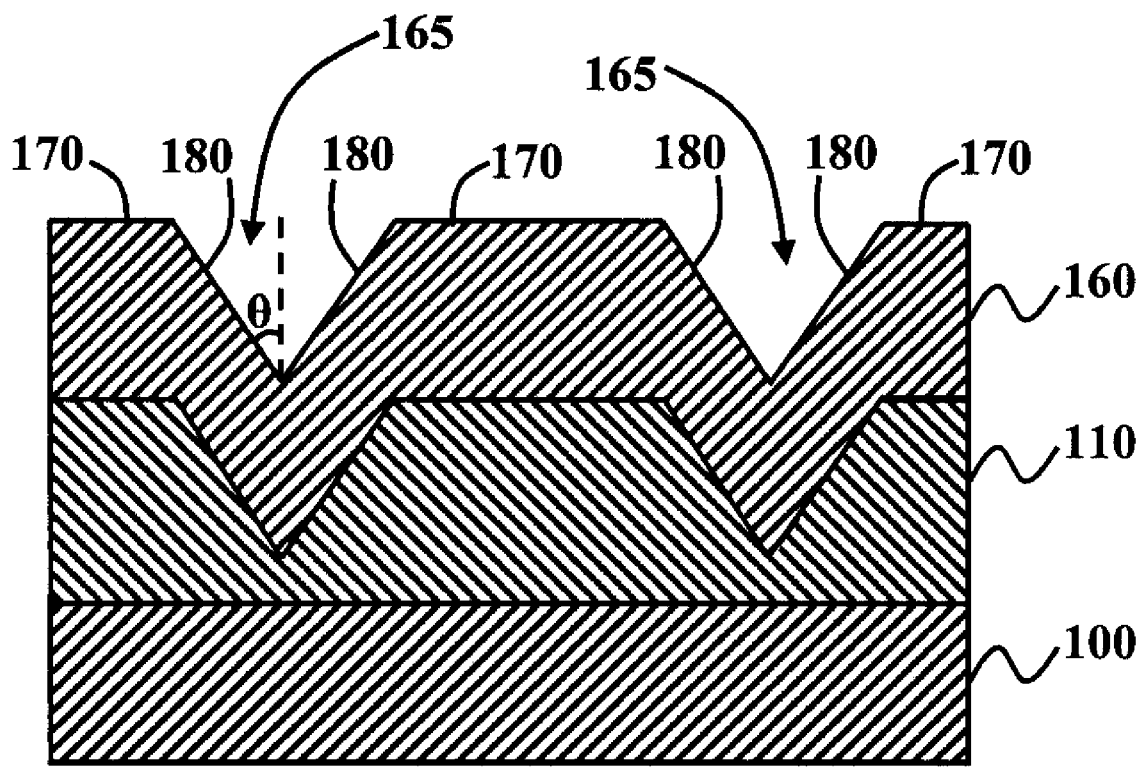

After the hardmask 120 is stripped, a Mo/Si multilayer 160 is deposited over the crystalline silicon layer 110 and is filled into the opened sloped region 155 of the crystalline silicon layer 110. As shown in FIG. 3(e) the Mo/Si multilayer 160 assumes the configuration of the underlying etched crystalline silicon layer 110 and includes sloped regions 165 having sloped sidewalls 180 configured above the underlying sloped region 155 of the crystalline silicon layer 110. Accordingly, the Mo/Si multilayer 160 completely fills the sloped region 155 the crystalline silicon layer 110. Furthermore, the Mo/Si layer 160 further comprises selective flat (level) surfaces 170 configured in between the uneven surfaces (uneven regions) 165.

Figure 4:
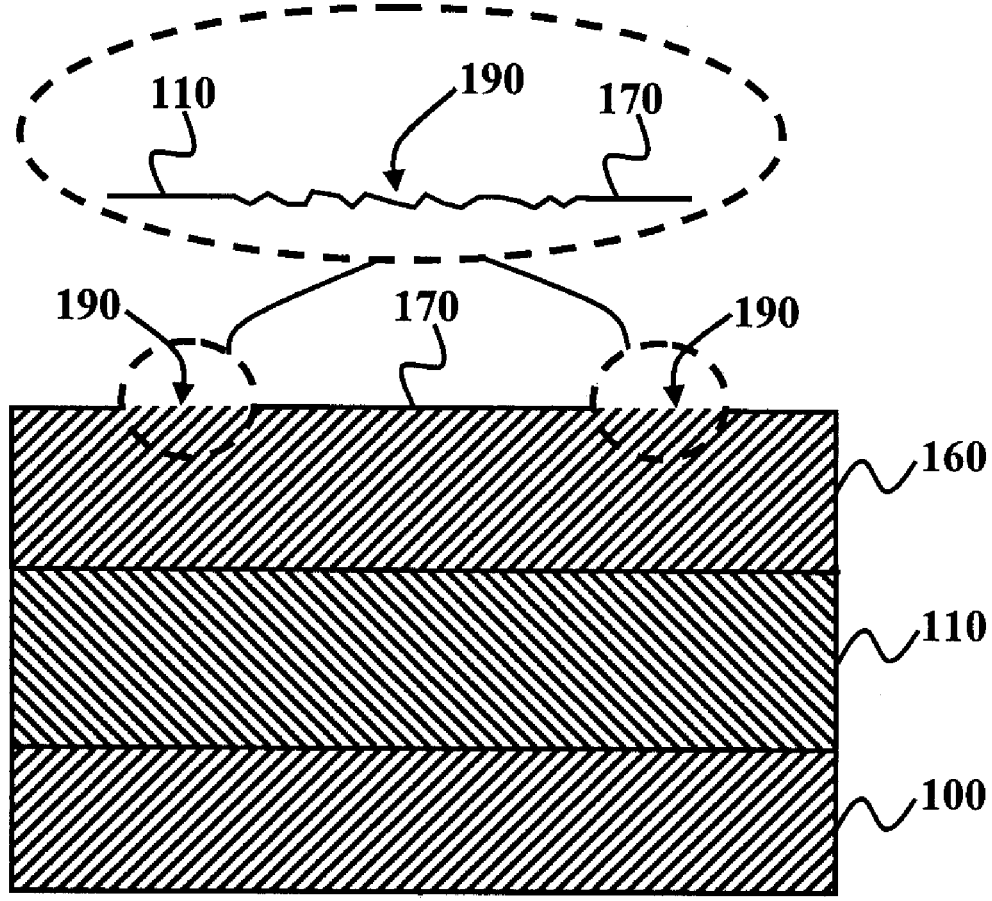
FIG. 4 is a schematic cross-section diagram of a EUVL mask according to an alternate embodiment of the invention.

Additionally, as shown in FIG. 3(e), the sloped sidewalls 180 are configured at an angle θ which will allow deflection of incoming ultraviolet radiation waves in order to prevent collection by exposure optics and to prevent printing onto a semiconductor wafer, wherein the angle θ is greater than a collection angle of the exposure optics. In one embodiment, the angle is created by etching the crystalline silicon layer 110 at an angle of θ that is 54 degrees from normal. The reflective multilayer is conformal to the underlying crystalline silicon 110 and matches the 54 degree. FIG. 4 illustrates an alternate embodiment of the invention, wherein the uneven portion 190 of the Mo/Si multilayer 160 is formed by roughening the surface 170 of the Mo/Si multilayer 160. Techniques that include reactive ion etching or wet etching can be used to roughen the surface 170. As shown in the magnified view within the dashed oval circle in FIG. 4, the uneven portion 190 may be configured as a jagged surface. The jagged surface can be defined as any roughness that deviates significantly from the target specification of <0.15 nm RMS (root mean square) surface roughness. A roughness of approximately 10 nm would prevent effective reflection of incident EUV radiation. The roughness is analogous to a micro version of the sloped surface that can be created with the anisotropic wet etching of silicon described above, and serves the same purpose on a smaller scale.

Figure 5A:
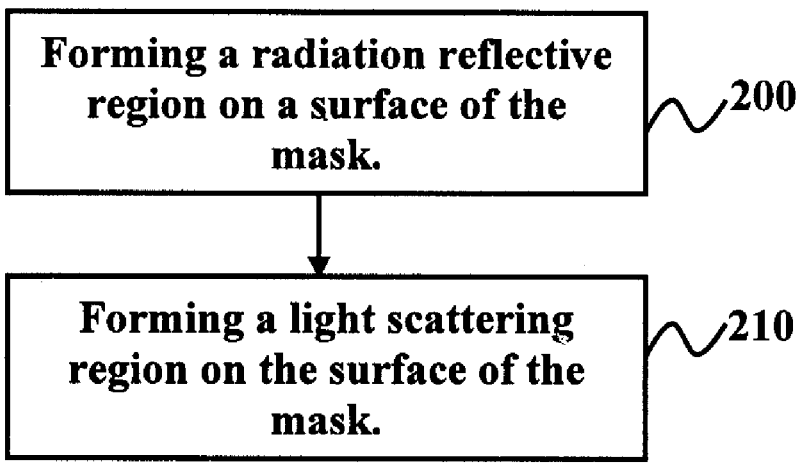
FIGS. 5(a) and 5(b) are flow diagrams illustrating preferred methods of the invention.
Figure 5B:
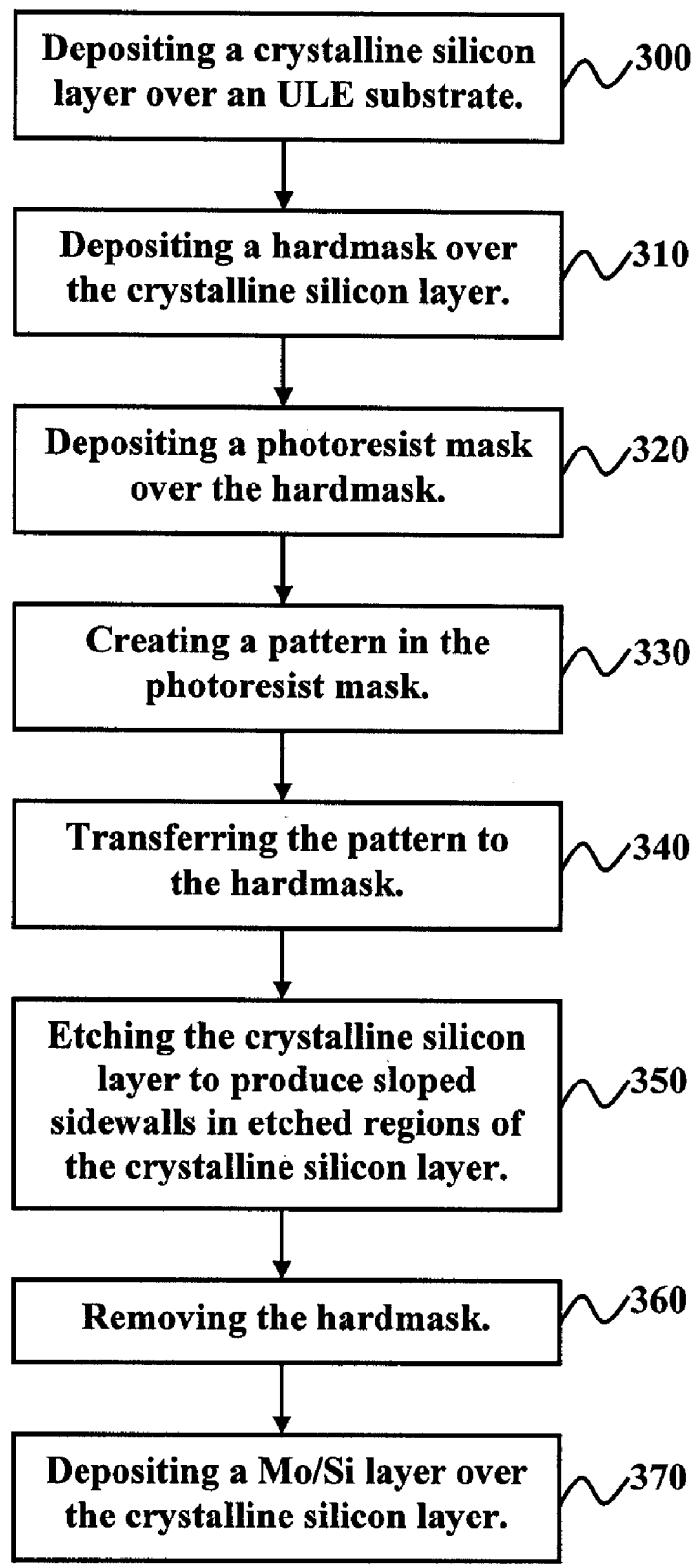

In FIGS. 5(a) and 5(b) flow diagrams illustrating preferred methods of forming an EUVL mask according to the invention are described. Generally, as provided in FIG. 5(a), a method of forming an EUVL mask comprises forming 200 a radiation reflective region 170 on a surface of the mask, and forming 210 a light scattering region 165, 190 on the surface of the mask, wherein the radiation reflective region 170 and the light scattering region 165, 190 are comprised of the same material (Mo/Si) 160.

More specifically, as shown in FIG. 5(b), the method of forming an EUVL mask according to the first embodiment of the invention comprises depositing 300 a crystalline silicon layer 110 over an ULE substrate 100, depositing 210 a hardmask 120 over the crystalline silicon layer 110, depositing 320 a photoresist mask 130 over the hardmask 120, creating 330 a pattern in the photoresist mask 130, transferring 340 the pattern to the hardmask 120, etching 350 the crystalline silicon layer 110 to produce sloped sidewalls 180 in etched regions 165 of the crystalline silicon layer 110, removing 360 the hardmask 120, and depositing 370 a Mo/Si layer 160 over the crystalline silicon layer 110. The Mo/Si layer 160 further comprises flat surfaces 170 configured to reflect incoming extreme ultraviolet radiation waves for printing a semiconductor wafer. Additionally, the Mo/Si layer 160 further comprises sloped sidewalls 180 corresponding to the sloped sidewalls 150 of the crystalline silicon layer 110. Furthermore, the sloped sidewalls 180 of the Mo/Si layer 160 are configured at an angle of at least 54 degrees from normal to deflect incoming extreme ultraviolet radiation waves to prevent printing to a semiconductor wafer.

The invention eliminates the need for a buffer or absorber layer within the mask stack and overcomes the problems inherent with conventional EUVL masks previously described. Because the multilayer is deposited as the final step in the mask fabrication, the multilayer will not be subjected to the plasma etches, wet etches, and multiple cleans that degrade the multilayer and consequently reduce the mask reflectivity. This higher reflectivity increases the mask contrast between reflective and scattering regions, decreases the required exposure time, and reduces the amount of radiation that is absorbed by the mask. Stepper throughput is the number of wafers that can be printed in a given time period, such as wafers/hour. Decreasing exposure time increases as described above directly increases stepper throughput.

Moreover, the inventive mask comprises a substrate 100 (which may include a bonded crystalline Si layer) and a multilayer 160 formed without an absorber or buffer layer. The absence of a raised absorber stack eliminates the shadow effect during wafer printing. This results in an abrupt transition from dark to reflective mask regions and the effect is an improvement in the edge contrast on the lithographic wafer. An additional advantage achieved by the invention is that the radiation is reflected so that there is less heating of the EUVL mask, which is a significant concern for image control and lifetime.

Generally, the invention includes a novel mask including an absorbing region 110 that is created before the Mo/Si multilayer 160 is deposited. The patterning can be achieved by either roughening the surface of the mask in regions 190 where the EUV light is not intended to reach the printed wafer surface or forming a grid of sloped sidewalls 180 in the regions 165 where the EUV light is not intended to reach the printed wafer surface. Techniques that include reactive ion etching or wet etching techniques can be used to either roughen the surface 190 or create the sloped sidewalls 180. The level pattern 170 that is to be reflected to the printed wafers surface will remain smooth and planar. After multilayer deposition 370, the uneven patterned areas 165, 190 act as the absorber of the EUVL mask because the reflective capabilities of the Mo/Si film 160 are locally destroyed. However, as described above, these regions 165, 190 do not actually absorb the EUV radiation but rather deflect the EUV radiation at an angle that will not develop the photoresist on the wafer.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phrases or terminology employed herein is for the purpose of description and not of limitation. Therefore, while the invention has been described in terms of preferred embodiments, those skilled in the art will recognize that the invention can be practiced with modification within the spirit and scope of the appended claims.

The invention claimed is:

1. An extreme ultraviolet lithography (EUVL) mask comprising an upper surface, wherein said upper surface consists of a reflective surface, said EUVL mask comprising:
   an extreme ultraviolet reflective region; and
   an extreme ultraviolet scattering region,
   wherein said extreme ultraviolet reflective region and said extreme ultraviolet scattering region are comprised of a same material.

2. The mask of claim 1, wherein said reflective region comprises a reflective multilayer comprising molybdenum and silicon, and wherein said multilayer comprises a flat surface configured to reflect incoming radiation waves for printing a semiconductor wafer.

3. The mask of claim 1, wherein said scattering region comprises a multilayer comprising molybdenum and silicon, and wherein said multilayer comprises a sloped surface configured at an angle to deflect incoming ultraviolet radiation waves to prevent collection by exposure optics and to prevent printing onto a semiconductor wafer.

4. The mask of claim 3, wherein said angle is greater than a collection angle of said exposure optics.

5. The mask of claim 1, wherein said scattering region comprises a roughened surface configured to deflect incoming ultraviolet radiation waves to prevent collection by exposure optics and to prevent printing onto a semiconductor wafer.

6. The mask of claim 1, wherein said scattering region comprises jagged surfaces configured to deflect incoming ultraviolet radiation waves to prevent collection by exposure optics and to prevent printing onto a semiconductor wafer.

7. The mask of claim 1, wherein said scattering region comprises a curved surface configured to deflect incoming ultraviolet radiation waves to prevent collection by exposure optics and to prevent printing onto a semiconductor wafer.

8. A radiation scattering reflective mask comprising an upper surface, wherein said upper surface consists of a reflective surface, said radiation scattering reflective mask comprising:
   an ultra low expansion substrate;
   a crystalline silicon layer adjacent to said ultra low expansion substrate; and
   a multilayer comprising molybdenum and silicon adjacent to said crystalline silicon layer,
   wherein said multilayer comprises a surface having level portions and uneven portions.

9. The mask of claim 8, wherein said uneven portions comprise sloped configurations arranged at an angle to deflect incoming ultraviolet radiation waves to prevent collection by exposure optics and to prevent printing onto a semiconductor wafer.

10. The mask of claim 9, wherein said crystalline silicon layer comprises a sloped surface, wherein said sloped surface of said crystalline silicon layer is aligned with said sloped configuration of said uneven portion.

11. The mask of claim 9, wherein said angle is greater than approximately 54 degrees from normal.

12. The mask of claim 8, wherein said level portions are configured to reflect incoming ultraviolet radiation waves for printing a semiconductor wafer.

13. The mask of claim 8, wherein said multilayer layer reflects radiation.

14. The mask of claim 8, wherein said multilayer scatters light on said uneven portions.

15. The mask of claim 8, wherein said uneven portions comprises a roughened surface configured to deflect incoming ultraviolet radiation waves to prevent collection by exposure optics and to prevent printing onto a semiconductor wafer.

16. The mask of claim 8, wherein said uneven portions comprise jagged surfaces configured to deflect incoming ultraviolet radiation waves to prevent collection by exposure optics and to prevent printing onto a semiconductor wafer.

17. The mask of claim 8, wherein said uneven portions comprise curved surfaces configured to deflect incoming ultraviolet radiation waves to prevent collection by exposure optics and to prevent printing onto a semiconductor wafer.

18. An extreme ultraviolet lithography mask comprising:
   a substrate;
   a crystalline silicon layer over said substrate; and
   a multilayer comprising molybdenum and silicon over said crystalline silicon layer,
   wherein said multilayer comprises a reflective region and a scattering region, and
   wherein said multilayer comprises an upper surface that consists of a reflective surface.

19. The mask of claim 18, wherein said substrate comprises an ultra low expansion substrate.

20. The mask of claim 18, wherein said scattering region comprises surfaces having sloped configurations arranged at an angle to deflect incoming ultraviolet radiation waves to avoid collection by exposure optics and to prevent printing onto a semiconductor wafer.

21. The mask of claim 20, wherein said crystalline silicon layer comprises sloped surfaces, wherein said sloped surfaces of said crystalline silicon layer are aligned with said sloped configuration of said surfaces of said scattering region.

22. The mask of claim 20, wherein said angle is approximately 54 degrees from normal.

23. The mask of claim 18, wherein said reflective region is configured to reflect incoming radiation waves for printing a semiconductor wafer.

24. The mask of claim 18, wherein said scattering regions comprise roughened surfaces configured to deflect incoming ultraviolet radiation waves to avoid collection by exposure optics and to prevent printing onto a semiconductor wafer.

25. The mask of claim 18, wherein said scattering region comprises jagged surfaces configured to deflect incoming radiation waves to avoid collection by exposure optics and to prevent printing onto a semiconductor wafer.

26. The mask of claim 18, wherein said scattering region comprises curved surfaces configured to deflect incoming ultraviolet radiation waves to avoid collection by exposure optics and to prevent printing onto a semiconductor wafer.

27. A method of forming an extreme ultraviolet lithography (EUVL) mask comprising an upper surface, wherein said upper surface consists of a reflective surface, said method comprising:
bonding a crystalline silicon layer adjacent to a substrate; and
forming a multilayer comprising molybdenum and silicon adjacent to said crystalline silicon layer,
wherein said multilayer comprises a surface having level portions and uneven portions.

28. The method of claim 27, wherein said crystalline silicon layer is anodically bonded to said substrate.

29. The method of claim 27, wherein prior to said step of forming a multilayer, said method further comprises:
depositing a hard mask over said crystalline silicon layer;
depositing a photoresist mask over said hardmask;
creating a pattern in said photoresist mask; and
transferring said pattern to said hardmask.

30. The method of claim 29, further comprising:
etching said crystalline silicon layer to produce uneven surfaces in etched regions of said crystalline silicon layer; and
removing said hardmask.

31. The method of claim 29, wherein said pattern is transferred to said hardmask using a plasma etch.

32. The method of claim 30, wherein said etching of crystalline silicon layer comprises an anisotropic silicon wet etch.

33. The method of claim 32, wherein said wet etch is performed using an alkaline solution.

34. The method of claim 27, wherein said substrate is formed of an ultra low expansion substrate.

35. The method of claim 30, wherein said etching is performed along <100> lattice planes of said crystalline silicon layer.

36. The method of claim 27, wherein said multilayer reflects radiation and scatters light.

37. The method of claim 27, wherein said level portions are configured to reflect incoming ultraviolet radiation waves for printing onto a semiconductor wafer.

38. The method of claim 27, wherein said uneven portions comprise sloped surfaces conformal to the underlying crystalline silicon layer, wherein said sloped surfaces are configured at an angle to deflect incoming extreme ultraviolet radiation waves to avoid collection by exposure optics and to prevent printing onto a semiconductor wafer.

39. The method of claim 38, wherein said angle is approximately 54 degrees from normal.

40. The method of claim 27, further comprising configuring said uneven portions to have a roughened surface to deflect incoming ultraviolet radiation waves to avoid collection by exposure optics and to prevent printing onto a semiconductor wafer.

41. The method of claim 27, further comprising configuring said uneven portions to have jagged surfaces to deflect incoming ultraviolet radiation waves to avoid collection by exposure optics and to prevent printing onto a semiconductor wafer.

42. The method of claim 27, further comprising configuring said uneven portions to have curved surfaces to deflect incoming radiation waves to avoid collection by exposure optics and to prevent printing onto a semiconductor wafer.

43. A method of forming an extreme ultraviolet lithography (EUVL) mask comprising an upper surface, wherein said upper surface consists of a reflective surface, said method comprising:
forming reflective regions on surfaces of said mask; and
forming scattering regions on said surfaces of said mask, wherein said reflective regions and said scattering regions comprise a same material.

44. The method of claim 43, wherein in said step of forming reflective regions, said reflective regions are formed of a multilayer comprising molybdenum and silicon, and wherein said multilayer comprises a flat surface configured to reflect incoming radiation for collection by exposure optics and for printing onto a semiconductor wafer.

45. The method of claim 43, wherein in said step of forming scattering regions, said scattering regions are formed of a multilayer comprising molybdenum and silicon, and wherein said multilayer conforms to sloped surfaces configured at an angle to deflect incoming radiation to avoid collection by exposure optics and to prevent printing onto a semiconductor wafer.

46. The method of claim 43, further comprising configuring said scattering regions to have roughened surfaces to deflect incoming ultraviolet radiation waves to avoid collection by exposure optics and to prevent printing onto a semiconductor wafer.

47. The method of claim 43, further comprising configuring said scattering regions to have a jagged surfaces to deflect incoming ultraviolet radiation waves to avoid collection by exposure optics and to prevent printing onto a semiconductor wafer.

48. The method of claim 43, further comprising configuring said scattering regions to have curved surfaces to deflect incoming radiation to avoid collection by exposure optics and to prevent printing onto a semiconductor wafer.

* * * * *